(12) United States Patent
Wang et al.

(10) Patent No.: US 8,610,589 B2
(45) Date of Patent: Dec. 17, 2013

(54) NOISE SUPPRESSION TECHNIQUES IN HIGH PRECISION LONG-TERM FREQUENCY/TIMING MEASUREMENTS

(75) Inventors: Hua Wang, Pasadena, CA (US); Seyed Ali Hajimiri, Pasadena, CA (US); Shouhei Kousai, Kawasaki (JP)

(73) Assignee: California Institute of Technology, Pasadena, CA (US)

( * ) Notice: Subject to any disclaimer, the term of this patent is extended or adjusted under 35 U.S.C. 154(b) by 843 days.

(21) Appl. No.: 12/710,334

(22) Filed: Feb. 22, 2010

(65) Prior Publication Data

US 2010/0245100 A1   Sep. 30, 2010

Related U.S. Application Data

(60) Provisional application No. 61/208,132, filed on Feb. 20, 2009.

(51) Int. Cl.
*G08B 21/00* (2006.01)
*G01R 13/34* (2006.01)

(52) U.S. Cl.
USPC .................. 340/635; 340/657; 324/76.58

(58) Field of Classification Search
USPC .............. 340/635, 652, 425.5, 636.15, 539.1, 340/612, 618, 620, 540, 657; 324/228, 324/76.58, 570.3, 433, 500, 523, 307, 309; 375/130, 316, 355, 360, 376, 260, 343, 375/346
See application file for complete search history.

(56) References Cited

U.S. PATENT DOCUMENTS

| | | | | |
|---|---|---|---|---|
| 6,900,895 | B2 * | 5/2005 | Van Wiggeren | 356/477 |
| 2003/0025639 | A1 * | 2/2003 | Rodney et al. | 343/719 |
| 2006/0193390 | A1 * | 8/2006 | Sedarat | 375/260 |

* cited by examiner

*Primary Examiner* — Anh V La
(74) *Attorney, Agent, or Firm* — Milstein Zhang & Wu LLC; Joseph B. Milstein

(57) ABSTRACT

A frequency/timing measurement apparatus includes a reference source having a reference source output terminal. At least one target source has a target source output terminal. The at least one target source is communicatively coupled to the reference source. A frequency timing measurement block has a first input terminal electrically coupled to the reference source output terminal. A second input terminal is electrically coupled to the target source output terminal and at least one output terminal. The frequency timing measurement block is configured to perform a noise shaping technique to reduce measurement error attributable to a phase noise that is correlated between the reference source and the target source, and to provide a reduced correlated noise measurement at the at least one output terminal. A method to reduce correlated noise is also described.

39 Claims, 18 Drawing Sheets

NOISE SUPPRESSION TECHNIQUES IN HIGH PRECISION LONG-TERM FREQUENCY/TIMING MEASUREMENTS

CROSS-REFERENCE TO RELATED APPLICATIONS

This application claims priority to and the benefit of U.S. provisional patent application Ser. No. 61/208,132, Noise Suppression Techniques in High-Precision Long-Term Frequency/Timing Measurements, filed Feb. 20, 2009, which application is incorporated herein by reference in its entirety.

FIELD OF THE INVENTION

The invention relates to noise suppression techniques in general and particularly to a noise suppression technique that employs correlated.

BACKGROUND OF THE INVENTION

High precision long term frequency/timing measurement plays a crucial role in engineering applications, such as, for example, in the fields of communications, electronics, and sensor systems. In applications ranging from measurement to frequency standards, precision is often limited by low frequency offset phase noise.

This noise can be attributed in part to "colored noise", noise that varies as a function of frequency, such as $1/f^3$ noise. Colored noise in high frequency measurements can be caused by up-conversion of low frequency noise. For example, flicker noise can appear at both the fundamental and harmonic frequencies of frequency/timing blocks. Since colored noise presents a high correlation between adjacent measurement samples, it cannot be suppressed using conventional sample averaging methods.

High precision long term frequency/timing measurements are important in modern biosensors, such as in magnetic biosensor applications. Magnetic biosensors in the form of portable microarrays have been proposed to replace or augment conventional fluorescent sensors, which need bulky and expensive optical systems. Also, portable microarray biosensors are promising for Point-of-Care (POC) medical applications, such as disease detection, control, and monitoring, where the key technical challenges are hand-held portability, high sensitivity, battery-level power consumption, and low cost.

However, magnetic sensors as reported thus far require external bias magnetic fields and/or complicated post-processing, limiting their form factor and cost. An ultrasensitive frequency-shift sensing scheme using high precision frequency/timing measurements has been proposed to address these issues. Yet, phase noise, particularly low frequency noise in portable microarray magnetic biosensor prototypes continues to be problematic.

What is needed, therefore, is a method and apparatus to substantially suppress phase noise power in frequency/timing measurements that does not significantly increase cost and power consumption.

SUMMARY OF THE INVENTION

In one aspect, the invention relates to a frequency/timing measurement apparatus that includes a reference source having a reference source output terminal. At least one target source has a target source output terminal. The at least one target source is communicatively coupled to the reference source. A frequency timing measurement block has a first input terminal electrically coupled to the reference source output terminal. A second input terminal is electrically coupled to the target source output terminal and at least one output terminal. The frequency timing measurement block is configured to perform a noise shaping technique to reduce measurement error attributable to a phase noise that is correlated between the reference source and the target source, and to provide a reduced correlated noise measurement at the at least one output terminal.

In one embodiment, the reference source and the at least one target source share at least one common circuit element.

In another embodiment, the at least one common circuit element is shared in a selected one of a time multiplexed manner and a simultaneous manner.

In yet another embodiment, the phase noise includes a low frequency phase noise.

In yet another embodiment, the low frequency phase noise includes $1/f^3$ noise.

In yet another embodiment, the reference source includes a reference source LC tank circuit and the at least one target source includes at least one target source LC tank circuit and the reference source LC tank circuit and the at least one target source LC tank circuit are configured to share a common oscillator active core in a selected one of a time multiplexed manner and a simultaneous manner.

In yet another embodiment, the apparatus includes one or more integrated cells, each integrated cell having a plurality of LC tank circuits, one of the LC tank circuits serving as the reference source LC tank circuit.

In yet another embodiment, apparatus includes two or more integrated cells addressed in a time multiplexed manner by a plurality of multiplexers.

In yet another embodiment, the reference source includes a reference source RC circuit and the at least one target source includes at least one target source RC circuit and the reference source RC circuit and the at least one target source RC tank are configured to share a common relaxation oscillator amplifier in a selected one of a time multiplexed manner and a simultaneous manner.

In yet another embodiment, frequency/timing measuring apparatus is integrated on a common substrate.

In yet another embodiment, frequency timing measurement block includes a plurality of cascaded delays and frequency counters.

In yet another embodiment, at least one of the frequency counters includes a one bit counter.

In yet another embodiment, the frequency/timing measurement apparatus includes M frequency counters and M cascaded delays. Each of the M cascaded delays are configured to have a delay $T_D$.

In yet another embodiment, the $M*T_D$ is equal to or greater than an oscillation period of a selected one of a reference frequency and a target source frequency.

In yet another embodiment, the apparatus includes a magnetic biosensor array.

In yet another embodiment, the magnetic biosensor array is configured to use a correlated double counting noise suppression technique.

In another aspect, the invention relates to a method to reduce correlated noise including the steps of: providing a reference source that generates a reference source signal and at least one target source that generates a target source signal, the reference source and the target source configured to establish a correlation of phase noise between the reference source signal and the at least one target source signal; providing a measurement block configured to measure a selected one of the reference source signal and the target source signal; counting N times differentially at least one of the at least one target source signal and the reference signal to provide N differential measurements; computing a reduced correlated noise measurement of each of the at least one target sources based on an average of the N differential measurements; and recording each of the reduced correlated noise measurements.

In one embodiment, the said step of providing a measurement block comprises providing a frequency timing block.

In another embodiment, the step of providing a frequency timing measurement block includes providing a fractional computing block.

In yet another embodiment, the step of counting differentially includes a simultaneous correlated differential counting scheme.

In yet another embodiment, the step of counting differentially includes a normal mode correlated differential counting scheme.

In yet another embodiment, the step of counting differentially includes an interleaving N mode correlated differential counting scheme.

In yet another embodiment, the step of counting differentially includes counting differentially over a time interval of τ/N, where τ is a total accumulated measurement for a selected one of a measurement of said reference source and a measurement of said target source and N is the total number of the interleaving sections.

In yet another embodiment, the fractional computing block includes a plurality of cascaded delays and frequency counters.

In yet another embodiment, the phase noise includes a low frequency phase noise.

In yet another embodiment, the low frequency phase noise includes $1/f^3$ noise.

In yet another embodiment, the step of providing a reference source and at least one target source further includes providing a reference source LC tank circuit and at least one target source LC tank circuit, the reference source LC tank circuit and at least one target source LC tank circuit configured to share a common oscillator active core in a selected one of a time multiplexed manner and a simultaneous manner.

In yet another embodiment, the step of providing a reference source and at least one target source further includes providing a reference source RC circuit and at least one target source RC circuit, the reference source RC circuit and at least one target source RC circuit configured to share a common relaxation oscillator amplifier in a selected one of a time multiplexed manner and a simultaneous manner.

In yet another aspect, the invention relates to a frequency/timing measurement apparatus that includes a reference source having a reference source terminal. At least one target source has target source terminal. At least one active core has at least two active core inputs, and an active core output terminal. The active core is configured to generate a frequency representative of a selected one of an inductance of the at least one target source and an inductance of the reference source. A switching circuit configured to electrically couple to the active core in a selected one of a time multiplexed manner and a simultaneous manner to a selected one of the reference source terminal and the at least one target source terminal. A frequency timing measurement block has a frequency timing measurement block input terminal electrically coupled to the active core output terminal, and at least one frequency timing measurement block output terminal. The frequency timing measurement block is configured to perform a noise shaping technique to reduce measurement error attributable to a phase noise that is correlated between the reference source and the target source, and to provide a reduced correlated noise measurement at the at least one frequency timing measurement block output terminal.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION

The techniques described herein use differential sensing between a measurement target and a measurement reference/standard. The measurement apparatus is configured to establish a correlation of the phase noise between the two sources. By applying this technique in combination with the timing methods described below, these techniques result in noise shaping of the correlated phase noise, and substantially suppress the correlated phase noise, particularly the low frequency-offset content.

Differential Sensing

Figure 1:
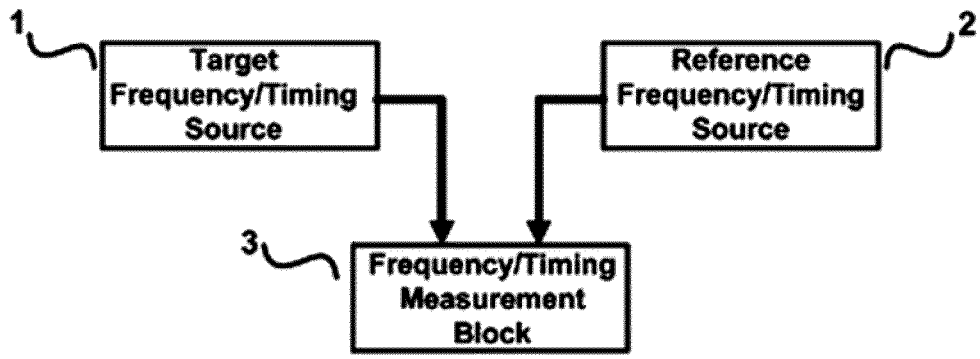
FIG. 1 shows a block diagram illustrating a differential sensing scheme.

FIG. 1 shows a block diagram illustrating a differential sensing scheme. In FIG. 1, block 1 is the target source we want to measure and block 2 is the reference source which serves as the frequency/timing standard. Block 3 senses the frequency/timing for the two sources. Block 3 can be implemented, for example, as simultaneous frequency counting or alternatively as alternate frequency counting between the blocks.

Figure 2:
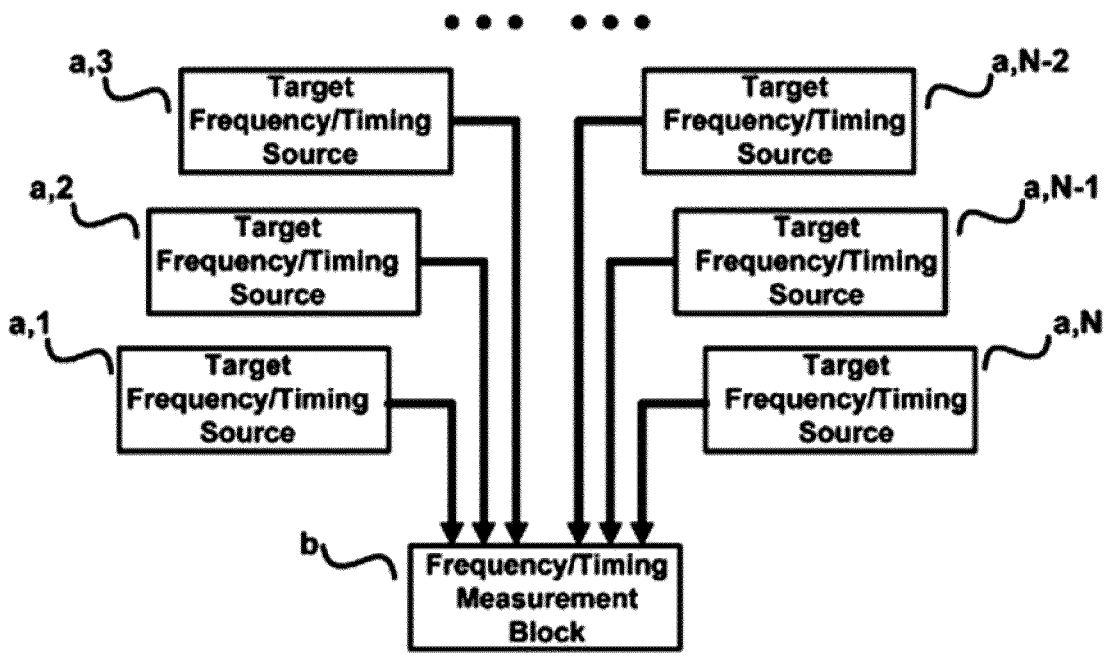
FIG. 2 shows a block diagram illustrating a differential sensing scheme useful for measuring N frequency/timing sources.

FIG. 2 shows a block diagram illustrating a differential sensing scheme useful for measuring N frequency/timing sources. In FIG. 2, any one of the N sources can function as the reference source, with the remaining N−1 sources being measured, with respect to the reference source, as N−1 target sources.

Figure 3A:
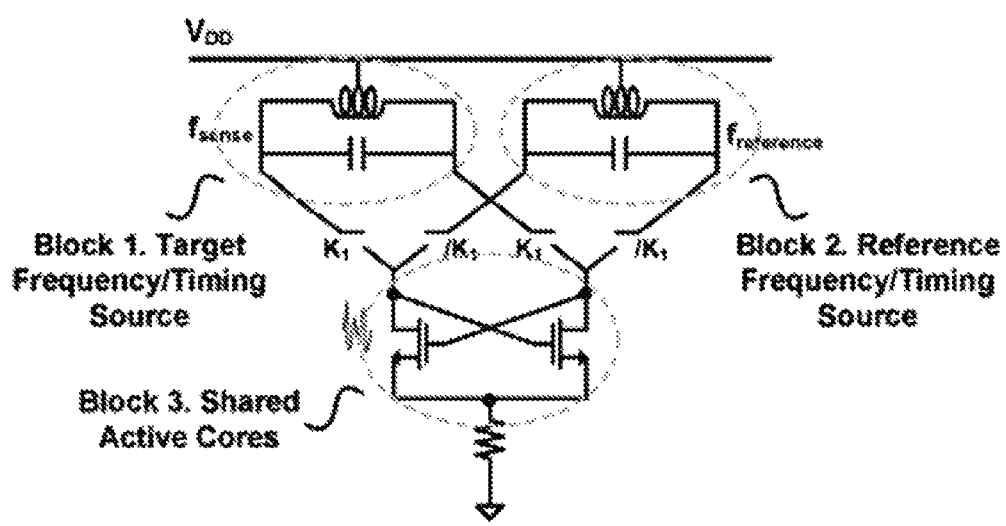
FIG. 3A shows one exemplary embodiment of an LC oscillator for establishing phase noise correlation between a reference source and one or more target sources.

There are many ways to establish correlation of the low frequency-offset noise between a reference source and one or more target sources. FIG. 3A shows one exemplary embodiment of an LC oscillator for establishing correlation of the phase noise between a reference source and one or more target sources. In this exemplary circuit topology, two resonant tanks share a common oscillator active core. Block 3 represents the shared active core which is used to establish correlation of the low frequency noise between the target source and the reference source. Switches $K_1$, /$K_1$, $K_2$, and /$K_2$ are used to control the connection between the active core and the resonant tanks. The active core can be thus shared by n sources in either a time multiplexed or in a simultaneous manner. It is understood that there can be additional $K_n$ switches to share the same active core with more than two tank circuits. Other circuits and methods exist to establish such correlation. It is expected that a target source can be communicatively coupled to a reference source so that phase noise is correlated between the reference source and the target source without using a shared circuit element such as a common active core.

Figure 3B:
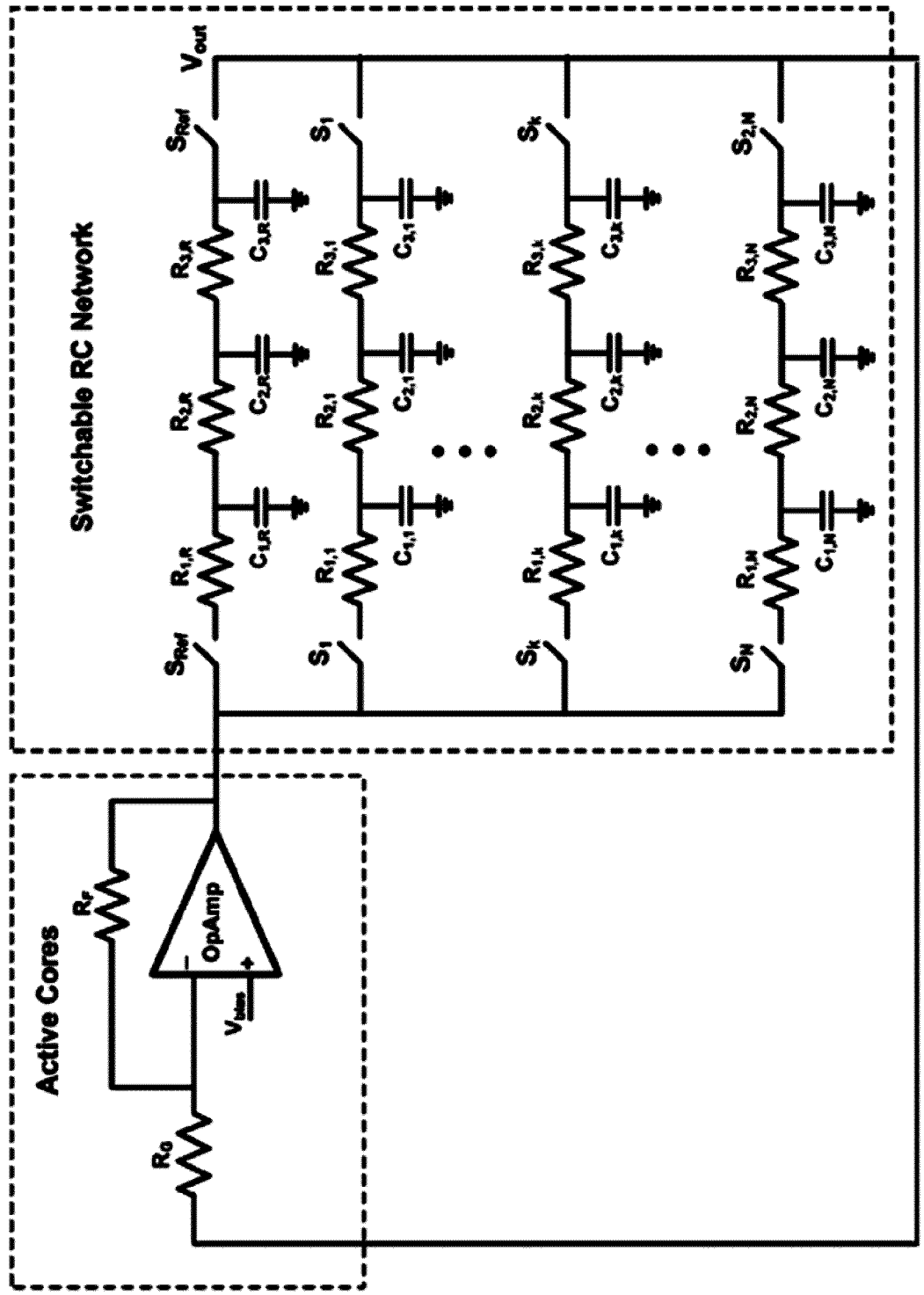
FIG. 3B shows another exemplary embodiment of a RC oscillator for establishing phase noise correlation between a reference source and one or more target sources.

FIG. 3B shows another exemplary embodiment of an RC oscillator for establishing correlation of noise, such as low frequency-offset noise, between a reference source and one or more target sources. In this circuit, the basic sensing or reference oscillator can include a feedback operational amplifier (Op-Amp) as an active core and a switchable RC network as N detection sites, which measures either a resistance (e.g. $R_{1,k}$–$R_{3,k}$) or a capacitance (e.g. $C_{1,k}$–$C_{3,k}$) change, where k is from 1 to N.

In an operational phase of detecting the "Reference", only the $S_{Ref}$ switches are closed. The feedback Op-Amp and the upper-most RC network form a relaxation-based Reference Oscillator. During detection sensing of a particular site$_k$, only the $S_k$ switches are closed. The feedback Op-Amp and the kth RC network form a relaxation-based sensing oscillator (of the kth sensing site).

In the embodiment of FIG. 3B, the dominant source of colored phase noise can typically be attributed to active devices in the Op-Amp. There is also a high correlation between the colored phase noise of the reference oscillator and the sensing oscillators. Such differential operation between the reference source and N target (sensing) sources, as described herein, greatly suppresses correlated phase noise, and increases detection (measurement) sensitivity.

While the embodiments of FIG. 3A and FIG. 3B show exemplary LC and RC reference and target source oscillators, other oscillators that can be made responsive to a physical parameter (e.g. the number of beads present in a sensing target volume), such as RL oscillators or any other suitable types of oscillators can be used.

Noise Shaping Techniques

Simultaneous Correlated Differential Counting Scheme

In the simultaneous correlated differential counting scheme, the two frequency/timing sources, such as are shown in FIG. 1, or the N frequency/timing sources of FIG. 2, are measured simultaneously. The frequency/timing difference is taken as the measurement results, yielding a high suppression of the correlated noise power of the sources.

Alternative Correlated Differential Counting Scheme (Normal Mode)

In many applications, such as for example, where there is strong coupling between sources, the simultaneous frequency/timing described hereinabove is less suitable. Therefore, it can be preferable to use another method such as the normal mode alternative correlation differential counting scheme.

Figure 4:
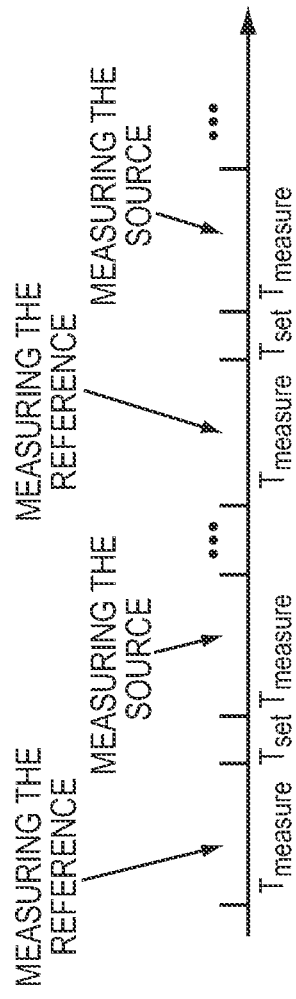
FIG. 4 shows a time line that illustrates the measurement process for a basic alternative differential sensing scheme.

FIG. 4 shows a time line that illustrates the measurement process for a basic alternative differential sensing scheme. For simplicity, we assume one reference source and one target source. Here, the two sources operate in different time slots, thus avoiding undesirable coupling between sources during a measurement.

We now turn to the case of multiple target sources to be measured in an alternative correlation differential counting scheme. We describe two exemplary alternative approaches for this case of N target sources as illustrated by the time lines of FIG. 5 and FIG. 6, in which N is an integer greater than one. Such schemes as described herein can also be combined.

Figure 5:
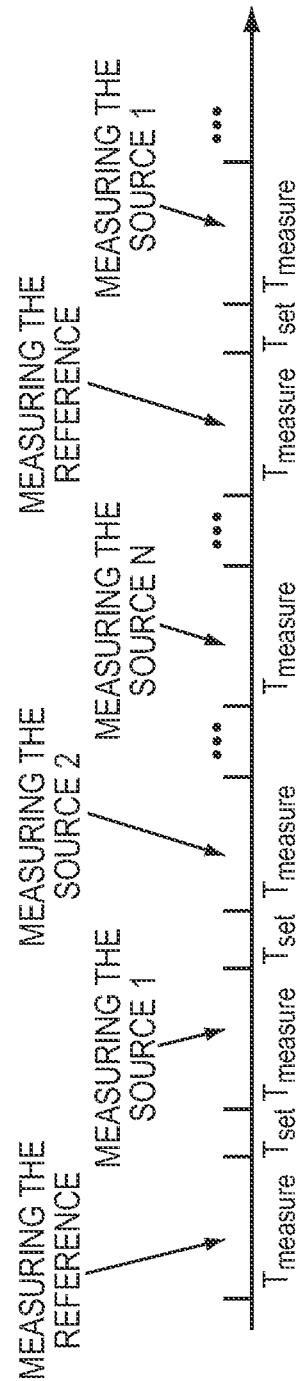
FIG. 5 shows a time line that illustrates one exemplary scheme for implementing an alternative differential sensing scheme for N target sources.

FIG. 5 shows a time line that illustrates one exemplary scheme for implementing an alternative differential sensing scheme for N target sources. In this embodiment, the reference source is first measured, followed by measurement of each of the N target sources. A measurement is made during each time interval $T_{measure}$. Between each measurement, there is a "reset" time $T_{set}$. $T_{set}$ can range from a fraction of $T_{measure}$ to substantially zero time.

Figure 6:
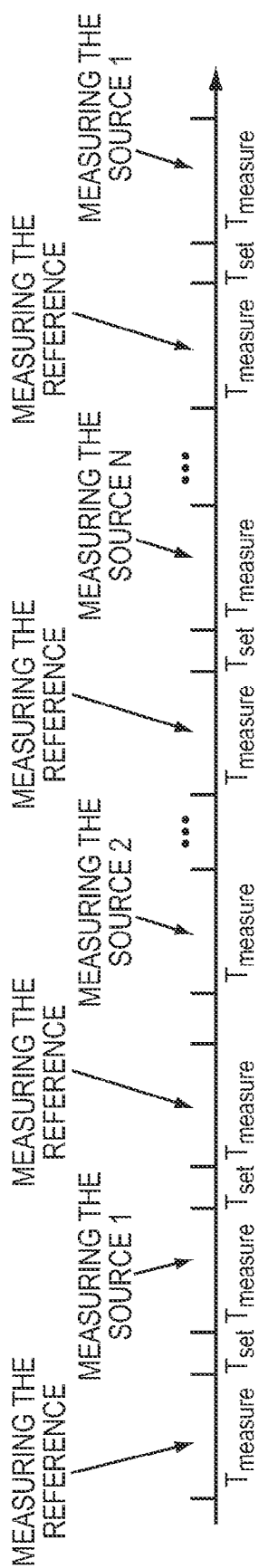
FIG. 6. shows a time line that illustrates another exemplary scheme for implementing an alternative differential sensing scheme for N target sources.

FIG. 6. shows a time line that illustrates another exemplary scheme for implementing an alternative differential sensing scheme for N target sources. In this embodiment, each time a target source is to be measured, a measurement of the reference source is made before or after each target source measurement.

Alternative Correlated Differential Counting Scheme (Interleaving N Mode)

In the alternative frequency counting case, low frequency-offset phase noise loses its correlation between measurement samples with long counting time, which limits noise suppression. However, this long counting scheme cannot be easily reduced since it limits the frequency sensing uncertainty. The interleaving N mode alternative correlated differential counting scheme addresses this issue.

Figure 7:
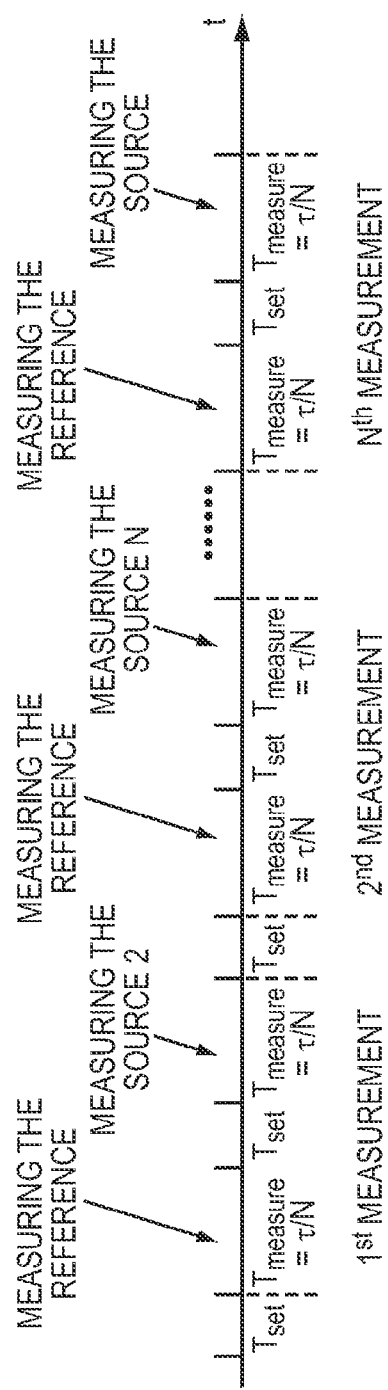
FIG. 7 shows a time line illustrating one exemplary scheme for implementing an interleaving N mode alternative correlated differential counting scheme for the exemplary case of one reference source and one target source.

FIG. 7 shows a time line illustrating one exemplary scheme for implementing an interleaving N mode alternative correlated differential counting scheme for the exemplary case of one reference source and one target source. In this scheme, the differential signal is given as an average of the N measurements, shown by the following equation:

$$\text{Differential Signal} = \frac{1}{N}\sum_{i=1}^{N} (\text{Target } Measurement_i - \text{Reference } Measurement_i)$$

where the Target Measurement$_i$ and Reference Measurement$_i$ are the measurements of the target source and the reference source in the "$i^{th}$" time slot, i varying from 1 to N.

It can be shown that this scheme provides a much higher rejection on the low frequency correlated noise between the reference source and the target source within the same total measurement time $2\tau$, assuming the reset time $T_{set}$ is negligible. In order to promote the functionality of this scheme, one needs to ensure that the measurement accuracy is high enough in the measurement slot $\tau/N$.

Figure 8A:
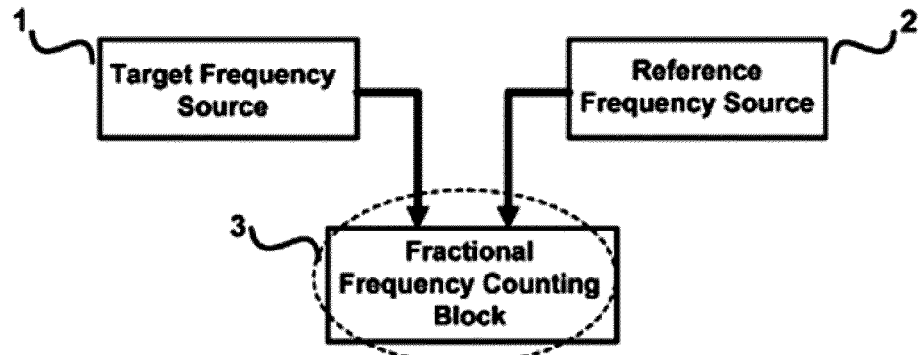
FIG. 8A shows a block diagram illustrating one exemplary implementation for interleaving N alternative correlated differential counting scheme for source frequency measurement.
Figure 8B:
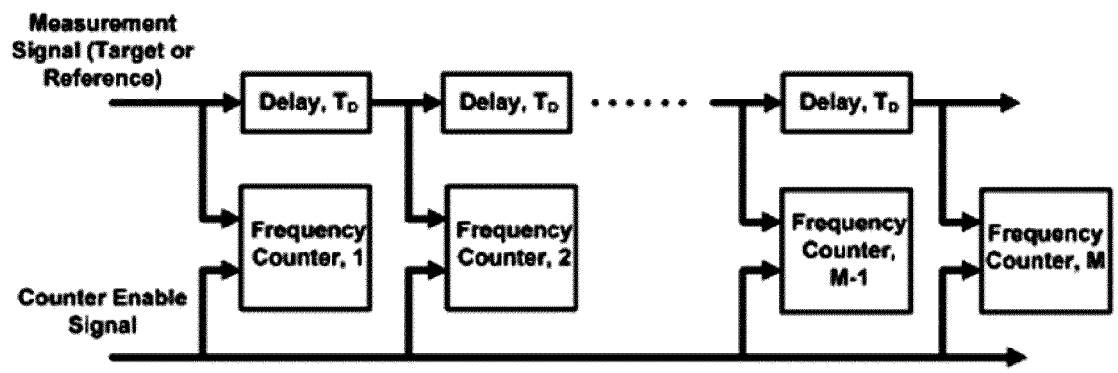
FIG. 8B shows one exemplary embodiment for implementing the fractional frequency counting block of FIG. 8A.
Figure 8C:
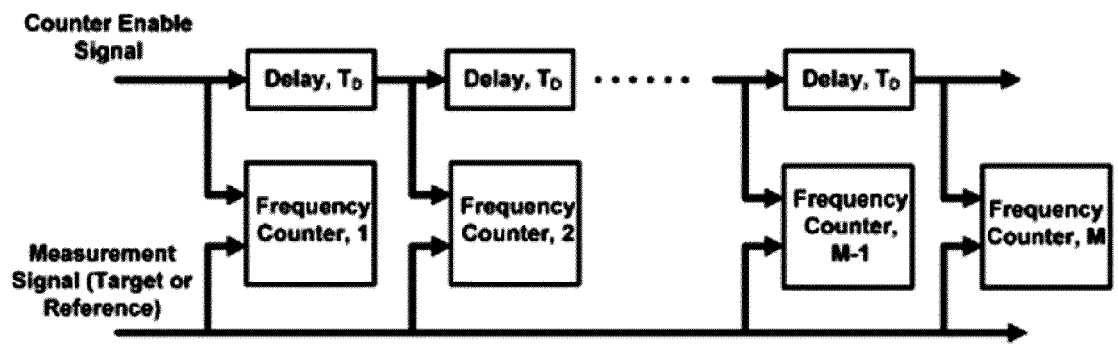
FIG. 8C shows an alternative exemplary embodiment for implementing the fractional frequency counting block of FIG. 8A.

FIG. 8A shows a block diagram illustrating one exemplary implementation for interleaving N alternative correlated differential counting scheme for source frequency measurement. The fractional counting block ensures that the measurement accuracy (accounting for uncertainty) for every $\tau/N$ slot is high enough so that the total frequency measurement is guaranteed. FIG. 8B and FIG. 8C show alternative exemplary embodiments for implementing the fractional frequency counting block of FIG. 8A. In FIG. 8B, one of the measurement signals (target or reference) is coupled to the first delay $T_d$ of a cascade of delays $T_d$ and to a first input of each of M counters while a counter enable signal is coupled to a second counter input of each of M counters. In FIG. 8C, a counter enable signal is coupled to the first delay $T_d$ of a cascade of delays $T_d$ and to a first input of each of M counters while one of the measurement signals (target or reference) is coupled to a second counter input of each of M counters. M is an integer greater than 1.

Therefore, if the total delay time $M*T_d$ is selected so that $M*T_d$ is equal to or slightly larger than the oscillation period of the signal we want to measure, by averaging on the M frequency counting inputs, we will get fractional with an accuracy of about $N/(T_d*M)$. Thus M can be selected for a desired frequency counting accuracy within the $\tau/N$ measurement time slot.

Also, if $M*T_d$ is made equal to or slightly larger than the oscillation period of the signal, the M frequency counter result will only differ on their least significant bit. Therefore, in some embodiments, one frequency counter can be implemented with the full number of bits while the rest of the M−1 counters can be implemented with only one bit, simplifying the counter implementation.

The interleaving N mode alternative correlated differential counting scheme can also be superimposed onto the other schemes (e.g. FIG. 5 and FIG. 6) to measure N sources.

Ultrasensitive CMOS Magnetic Biosensor Array with Correlated Double Counting Noise Suppression A scalable and ultrasensitive frequency-shift magnetic biosensing array scheme using noise suppression techniques described hereinabove is now described in detail. In this illustrative example, the theoretical limit of the sensor noise floor is substantially dominated by the phase noise of the sensing oscillators. To increase the sensitivity, a noise suppression technique, Correlated Double Counting (CDC) with no power overhead is used. As an implementation example, a 64-cell sensor array was designed in a standard 65 nm CMOS process. The CDC scheme achieved an additional 6 dB noise suppression. The magnetic sensing capability of the presented sensor was verified by detecting micron size magnetic particles with a signal-to-noise ratio (SNR) of 14.6 dB for a single bead and an effective dynamic range of at least 74.5 dB.

The fundamental noise floor of this sensing scheme is modeled, and a noise suppression technique, Correlated Double Counting (CDC), as described and implemented achieved 6 dB of noise reduction without any power overhead in the sensor array.

Sensing Scheme and Noise Suppression Technique

Magnetic biosensing is typically accomplished using a sandwich bioassay. The target molecules are first captured by pre-deposited molecular probes onto the sensor surface. Magnetic particles (labels) coated with other types of probes are then added and immobilized by the captured target molecules. Therefore, one can detect the presence of target molecules in the sample by sensing the magnetic labels left on the surface.

Frequency Shift Magnetic Sensing and Noise Analysis

In the frequency-shift sensing scheme, the inductor of an on-chip LC oscillator functions as the sensing core. The AC current through the inductor generates a magnetic field to polarize the magnetic partides present within a sensing space or volume of the sensing core. This presence of magnetic particles increases the total magnetic energy in the space and thus leads to an effective increase in the sensing inductor inductance. Consequently, an on-chip LC oscillator can sense this inductance increase via a corresponding downshift in oscillation frequency, as we described in "A Frequency-Shift CMOS Magnetic Biosensor Array with Single-Bead Sensitivity and No External Magnet," H. Wang, et al., IEEE ISSCC Dig. Tech. Papers, pages 438-439, February 2009, U.S. patent application Ser. No. 12/399,603, EFFECTIVE-INDUCTANCE-CHANGE BASED MAGNETIC PARTICLE SENSING, filed Mar. 6, 2009 and U.S. patent application Ser. No. 12/559,517, A FREQUENCY-SHIFT CMOS MAGNETIC BIOSENSOR ARRAY WITH SINGLEBEAD SENSITIVITY AND NO EXTERNAL MAGNET, filed Sep. 15, 2009. The Ser. Nos. 12/399,603 and 12/559,517 applications are both incorporated herein by reference in their entirety for all purposes.

Figure 9:
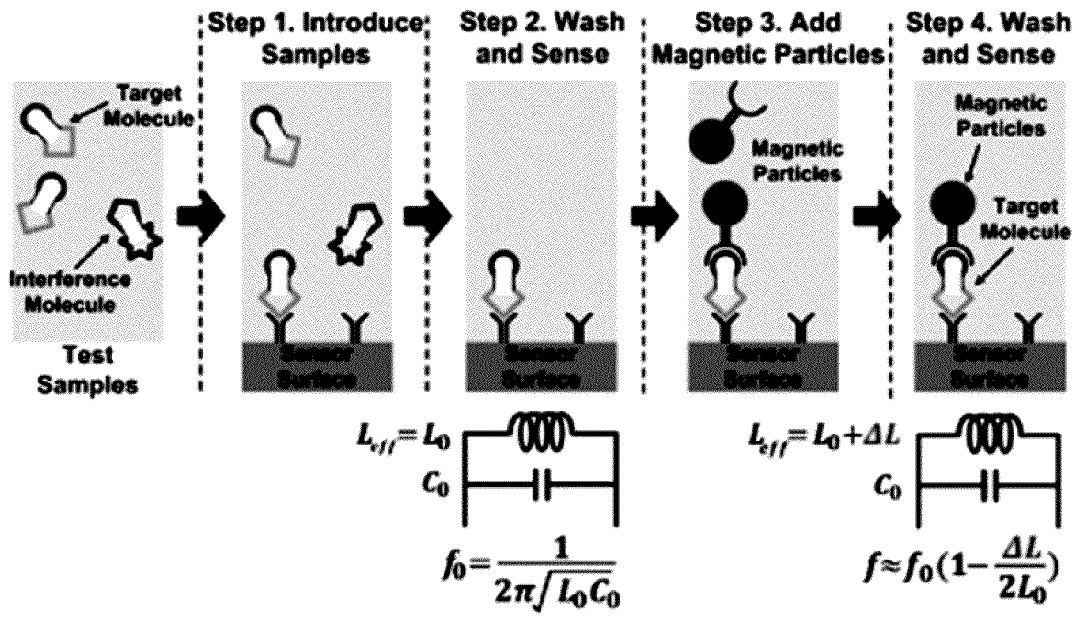
FIG. 9 shows an illustration of an inductive frequency shift magnetic sensing scheme.

FIG. 9 shows an illustration of an inductive frequency shift magnetic sensing scheme. The oscillation frequency is measured by frequency counting (i.e. recording the number of rising edges within a given counting time T). Therefore, the noise floor is set by the timing jitter $\sigma_T^2$ of the waveform which is determined by its phase noise spectrum, $S_{100}(\omega)$. The relative frequency error $\sigma^2_{66,f/f_0}$ in frequency counting can thus be calculated as $$\sigma^2_{\Delta f/f_0} = \frac{(\Delta f)^2}{f_0^2} = \qquad (1)$$

$$\frac{\sigma_T^2}{T^2} = \frac{1}{T^2\omega_0^2}E\{[\phi(T) - \phi(0)]^2\} = \frac{4}{\pi\omega_0^2 T^2}\int_0^{+\infty} S_\phi(\omega)\sin^2\frac{\omega T}{2}d\omega,$$

where $f_0=\omega_0/2\pi$ is the oscillation frequency and $\omega$ is the offset frequency for the SSB phase noise $S_{100}(\omega)(\omega)$. $(\Delta f)^2$ represents the frequency uncertainty during counting.

Figure 10:
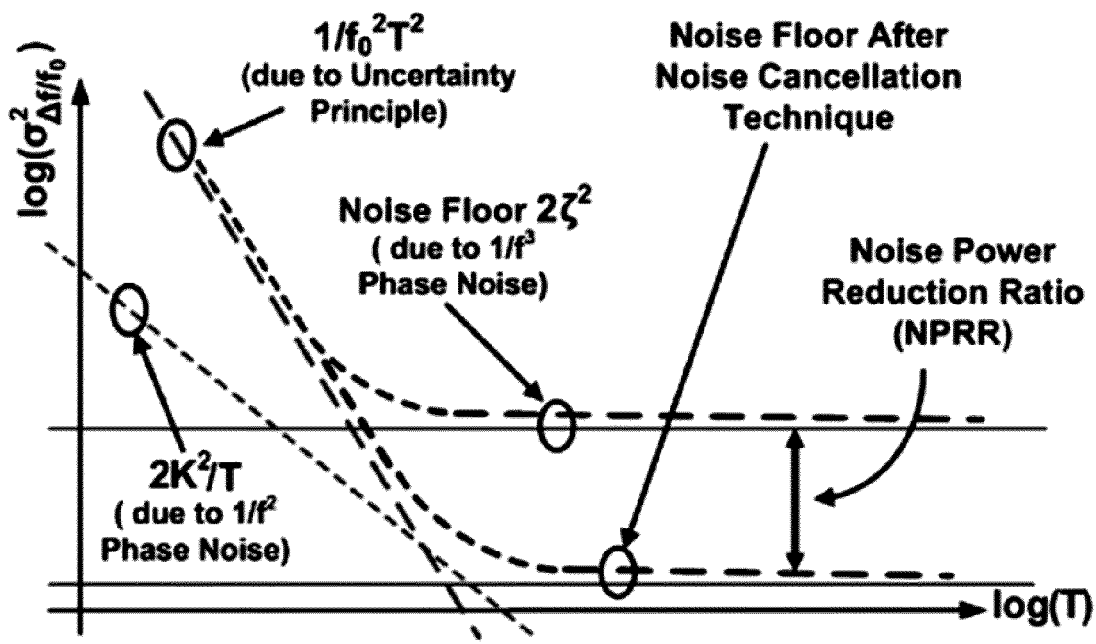
FIG. 10 shows an exemplary graph of a noise floor for an oscillator based frequency shift sensing device.

At a short counting time ($T>>2\pi/\omega_{1/f^3}$, where $\omega_{1/f^3}$ is the 1/f^3 corner frequency of the phase noise $S_{100}(\omega)$, 1/f^2 noise dominates the jitter and $\sigma_{\Delta f/f_0}^2$ is inversely proportional to T:

$$\sigma^2_{\frac{\Delta f}{f_0}} = \frac{\sigma_T^2}{T^2} = \frac{\kappa^2 T}{T^2} = \frac{\kappa^2}{T}, \qquad (2)$$

where $\kappa$ is the 1/f^2 jitter coefficient for the oscillator. For a large counting interval ($T>>1/f_{1/f^3}$), 1/f^3 phase noise dominates and leads to $\sigma_{\Delta f/f_0}^2$ independent of T:

$$\sigma^2_{\Delta f/f_0} = \frac{\sigma_T^2}{T^2} = \frac{\zeta^2 T^2}{T^2} = \zeta^2, \qquad (3)$$

where $\zeta$ is the 1/f^3 jitter coefficient. Moreover, due to the uncertainty principle (effect of finite counting window length), there exists a measurement error proportional to $1/f_0^2T^2$. The total frequency uncertainty can be plotted, which shows that $\zeta^2$ determines the ultimate sensor noise floor. FIG. 10 shows one exemplary graph of a noise floor for an oscillator based frequency shift sensing device.

In some embodiments, differential sensing can be used by pairing a sensing oscillator with a reference oscillator. To eliminate common-mode drift due to effects, such as supply and temperature variations, the frequeny difference of the sensing oscillator and the reference oscillator is taken as the sensor output. In differential sensing, an extra factor of 2 appears in $\sigma_{\Delta f/f_0}^2$ for noise power doubling, $$\sigma^2_{\Delta f/f_0} = \frac{8}{\pi\omega_0^2 T^2}\int_0^{+\infty} S_\phi(\omega)\sin^2\frac{\omega T}{2}d\omega. \qquad (4)$$

Correlated Double Counting (CDC) Noise Suppression Technique

Based on the analysis above, 1/f^3 phase noise (captured by the $\zeta^2$ coefficient) sets the minimum sensor noise floor. This 1/f^3 phase noise is determined by the flicker noise of the devices and the waveform properties of the oscillators and is generally difficult to reduce beyond a certain level. The 1/f^3 noise jitter ($\zeta^2T^2$) accumulates at a faster rate due to its long correlation time. While this correlation results in a higher-integrated noise power, it also creates a possibility of noise cancellation.

Figure 11:
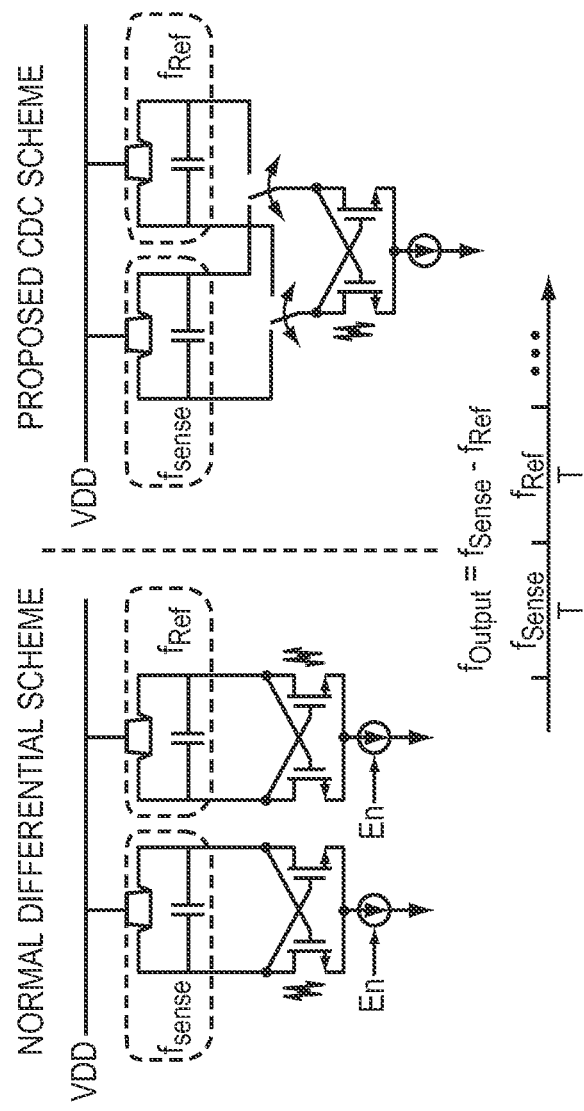
FIG. 11 shows a schematic diagram illustrating both a normal differential sensing scheme and CDC (Correlated Double Counting) scheme where $1/f^3$ phase noise is correlated between the two oscillators.
Figure 12:
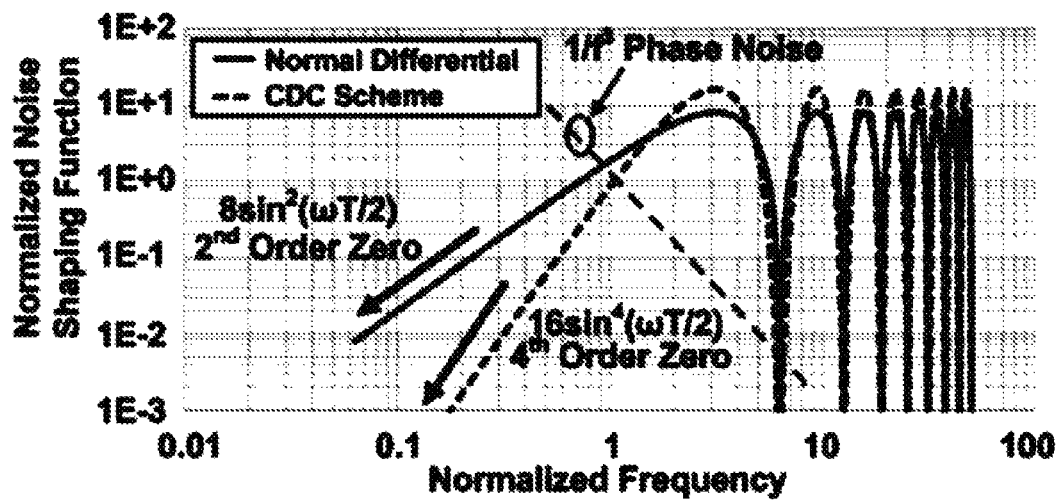
FIG. 12 is a noise shaping graph showing noise shaping functions for a normal differential scheme and a CDC scheme.

In a normal differential sensing, the jitters are uncorrelated between the sensing and the reference oscillator, which gives the factor of 2. However, if the 1/f^3 phase noise is correlated between the two oscillators, this correlated noise can be subtracted by a correlated double counting (CDC) scheme, where subtracting one frequency count from the other will reduce the correlated noise component and thus lowers the measurement uncertainty floor as shown in FIG. 10. Since 1/f^3 phase noise is mainly from flicker noise upconversion of the active devices in a CMOS oscillator, this suggests designing the two oscillators in a way to increase the flicker noise correlation between the reference and sensing cores, e.g. active core sharing; during differential operation to achieve 1/f^3 phase noise correlation between the oscillators. FIG. 11 shows a schematic diagram illustrating both a normal differential sensing scheme and CDC scheme where 1/f^3 phase noise is correlated between the two oscillators.

This noise suppression technique, roughly analogous to the Correlated Double Sampling (CDS) used in image sensors, does not increase the power consumption or chip area. Moreover, this CDC scheme with oscillator based frequency-shift sensing provides a general sensor design methodology which can be applied to any type of sensor that measures LC resonant changes, e.g. capacitive sensing in pressure sensors.

The CDC scheme can be modeled mathematically. Assuming $\phi(t)$ as the correlated random phase of the oscillator waveform, the effective noise for the CDC scheme is:

$$\sigma^2_{\Delta f/f_0} = \frac{1}{T^2\omega_0^2}E\{[\phi(2T) - \phi(T) - [\phi(T) - \phi(0)]]^2\} = \qquad (5)$$

$$\frac{16}{\pi\omega_0^2 T^2}\int_0^{+\infty} S_\phi(\omega)\sin^4\left[\frac{\omega T}{2}\right]d\omega,$$

where T is the counting time and $\omega_o$ is the nominal oscillation frequency. Noise shaping functions for a normal differential scheme and the CDC scheme can be defined and plotted as shown in the noiseithapint graph of FIG; 12. Compared with the normal differential case, the CDC scheme provides a 4th order zero at low frequency offsets enabling the suppression on the 1/f^3 phase noise.

Furthermore, assuming a 1/f^3 phase noise profile of $S_{\phi,1/f^3}(\omega)(\omega)$, the Noise Power Reduction Ratio (NPRR) between the two schemes can be numerically calculated as $$NPRR = \frac{\sigma^2_{\Delta f/f_o,diff}}{\sigma^2_{\Delta f/f_o,CDFC}} = \qquad (6)$$

$$\frac{\frac{8}{\pi\omega_0^2 T^2}\int_0^{+\infty} S_{\phi,\frac{1}{f^3}}(\omega)\sin^2\frac{\omega T}{2}d\omega}{\frac{16}{\pi\omega_0^2 T^2}\int_0^{+\infty} S_{\phi,\frac{1}{f^3}}(\omega)\sin^4\left[\frac{\omega T}{2}\right]d\omega} = 2\zeta^2 \Big/ \sigma^2_{\frac{\Delta f}{f_{o,CDFC}}} \approx 9.8 \text{ dB},$$

where $\zeta^2$ can be calculated for a given 1/f^3 phase noise. This shows a noise reduction ratio of up to 9.8 dB can be achieved by the CDC scheme.

Sensor System Implementation

In this section, a CMOS magnetic sensor array with the CDC scheme is presented as an exemplary embodiment.

Quad-Core Sensor Cell

Figure 13:
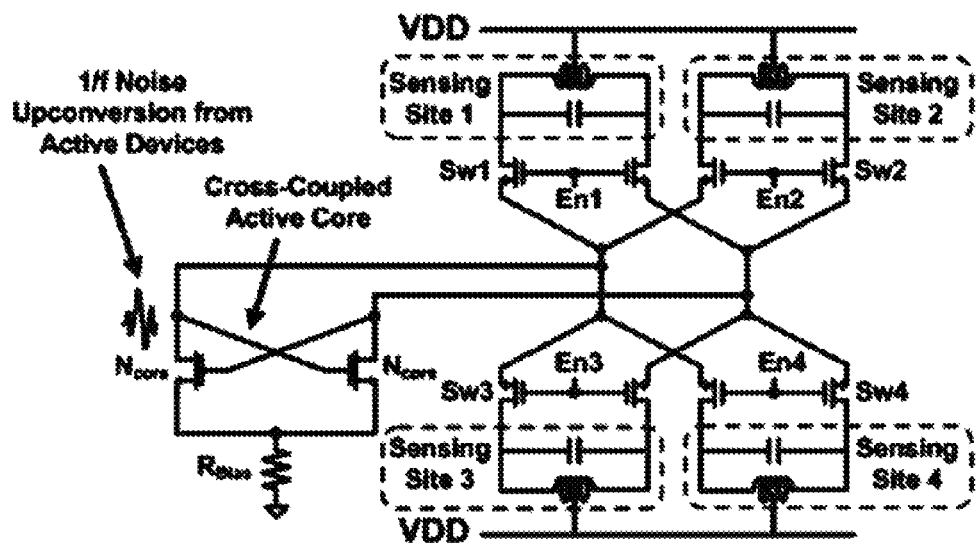
FIG. 13 shows a schematic diagram of the exemplary quad-core CDC sensor cell.

Each sensor cell in the array was designed with four sensing sites (four sensing inductors) where any of the four can be selected to function as the reference sensor and the other three as active sensors. FIG. 13 shows a schematic diagram of the exemplary quad-core CDC sensor cell. To maintain correlation of the 1/f^3 phase noise between differential sensing, the four sensing inductors were designed to share the same crosscoupled core, whose up-converted flicker noise dominates the $1/f^3$ phase noise. NMOS switches were used to couple the desired LC tank with the active core. The switches were optimized to minimize their $1/f^3$ phase noise which is uncorrelated during differential sensing and cannot be suppressed by the CDC scheme. The sensing oscillators' nominal frequency was 1 GHz.

Sensor System Architecture

Figure 14:
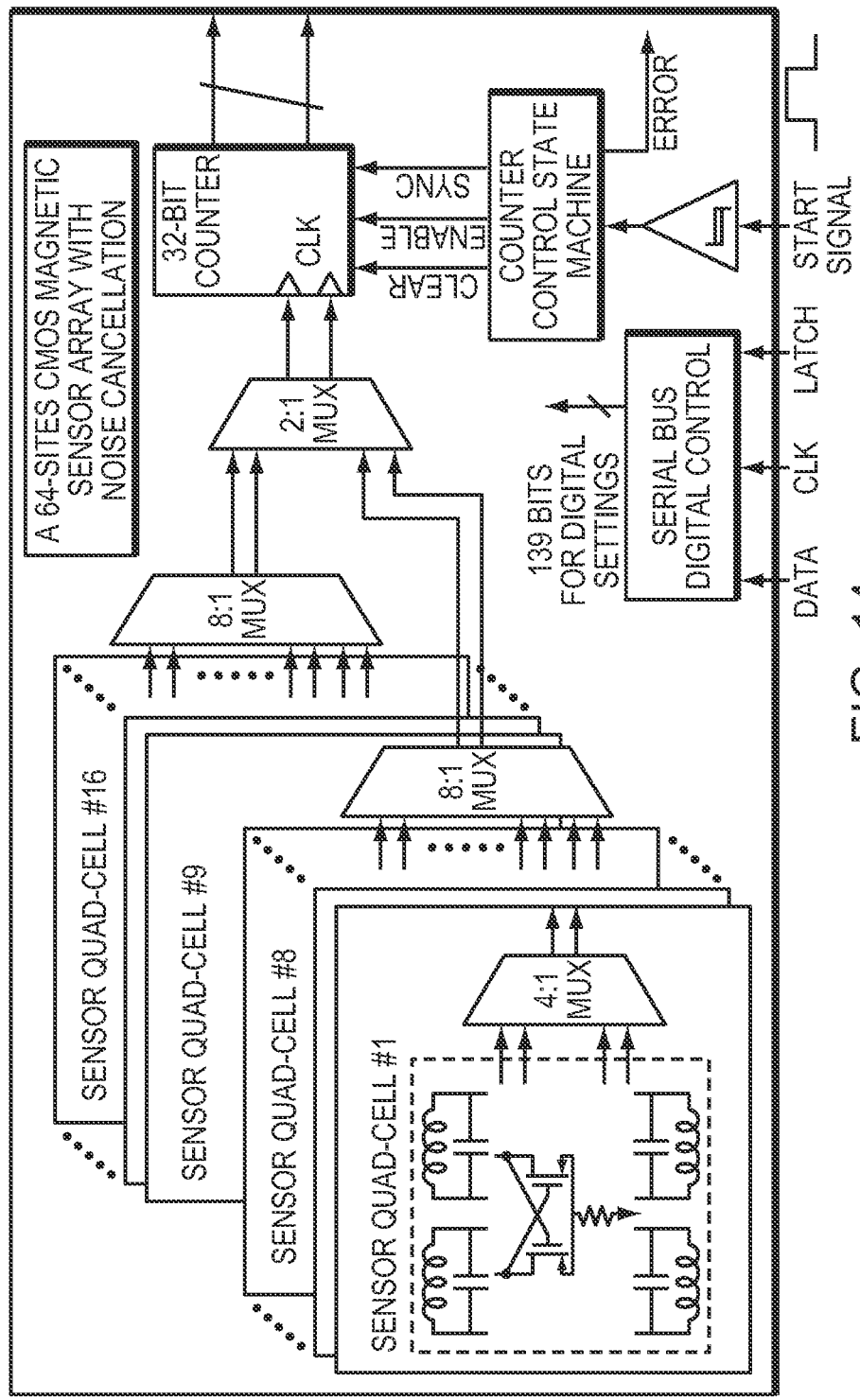
FIG. 14 shows a block diagram of the complete exemplary sensor system architecture.

FIG. 14 shows a block diagram of the complete exemplary sensor system architecture. Sixteen quad-cell sensor cells were implemented on the same CMOS chip for high throughput. Multiplexers were designed to feed the sensing oscillator output to the on-chip frequency counter (e.g. in a time multiplexed manner). Since only one of the sensing sites in each quad-cell is needed to act as the reference, each chip has 48 useful sensor sites overall. Moreover, this architecture is scalable to a large scale array on one chip. In addition, since the sensor chip's IOs only have DC supply and digital inputs/outputs, multiple chips can easily be tiled for ultra-high throughput applications, such as genomic sequencing and genotyping.

Figures 15A, 15B:
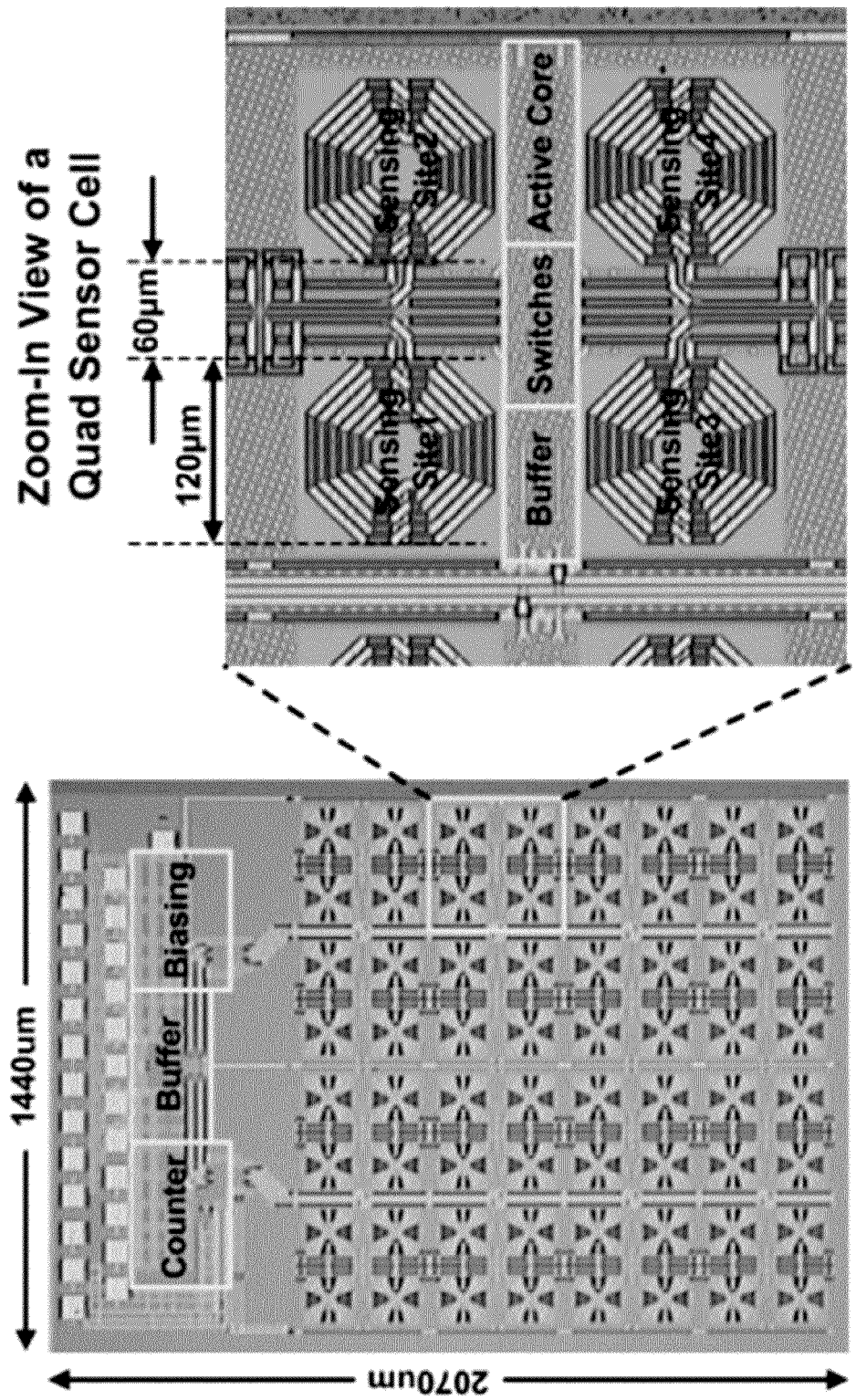
FIG. 15A shows a chip microphotograph of the system, and FIG. 15B, a zoom-in view of one of the quad-core sensor cells.

FIG. 15A shows a chip microphotograph of the system, and FIG. 15B shows a zoom-in view of one of the quad-core sensor cells. The sensing inductor is a 120 μm 6-turn symmetric spiral with Q of 6.8 at 1 GHz. The sensing inductor spacing of 60 μm was chosen to balance the integration level with the coupling from adjacent cells. The total system power consumption is 80 mW.

Sensor Electrical Performance

Figure 16:
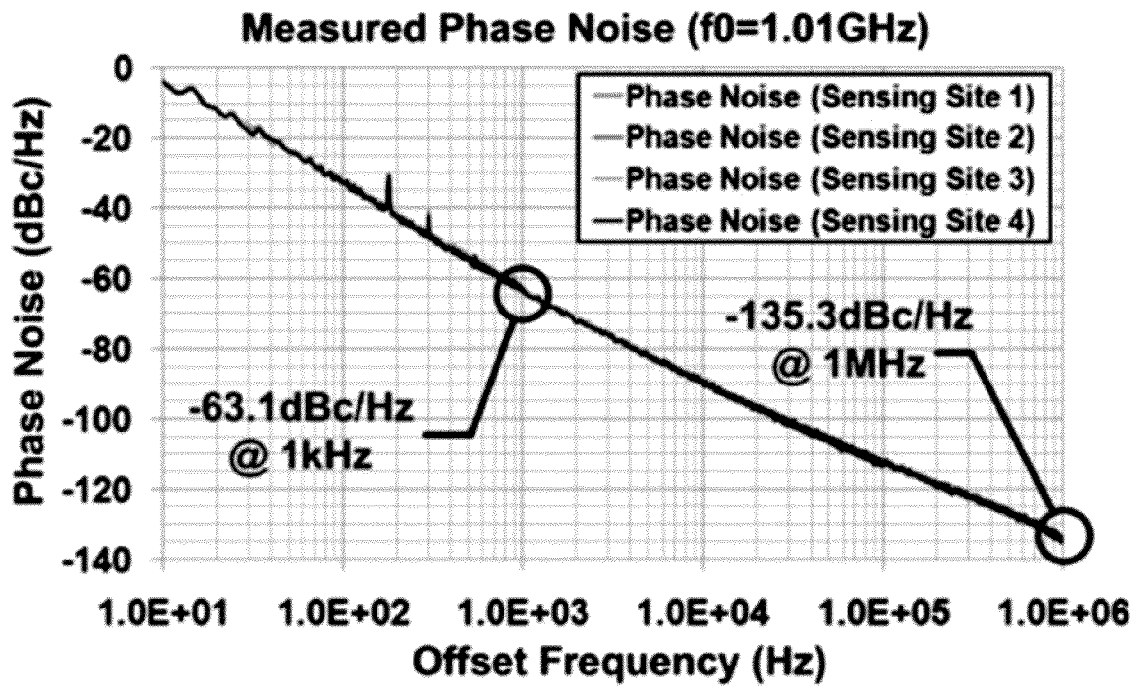
FIG. 16 shows a graph of the measured oscillator's phase noise.

The sensor oscillator's phase noise was measured with an RDL phase noise analyzer, achieving a nominal phase noise of −63.1 dBc/Hz and −135.3 dBc/Hz at 1 kHz and 1 MHz offsets, respectively. FIG. 16 shows a graph of the measured oscillator's phase noise.

Figure 17:
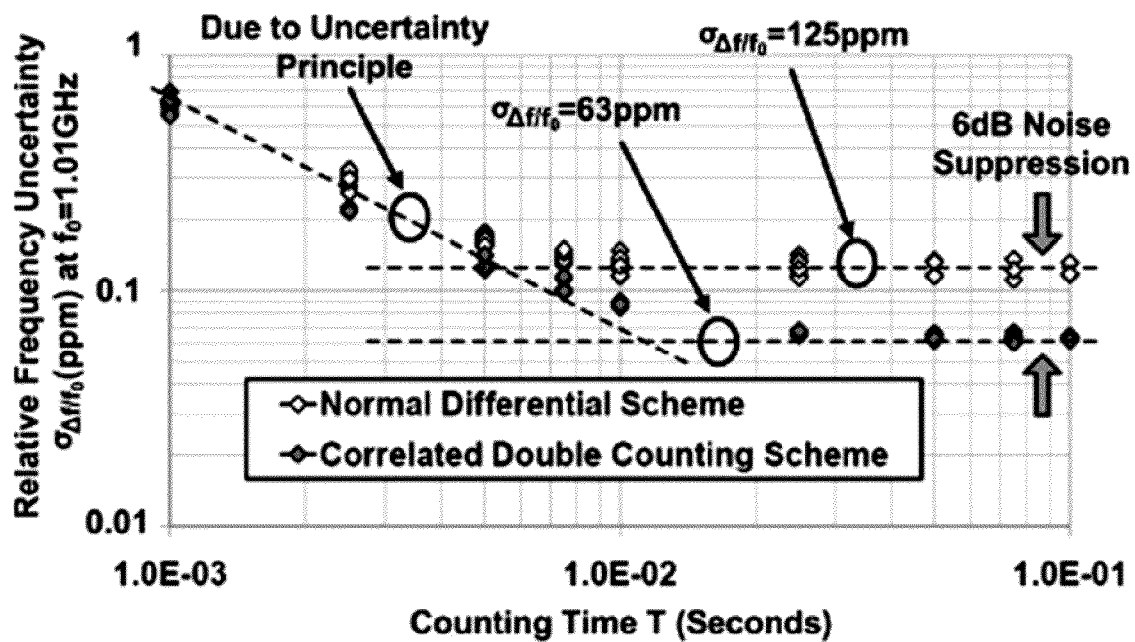
FIG. 17 shows an exemplary graph of frequency uncertainty plotted against counting time.

The noise suppression functionality of the CDC scheme described herein can be verified through frequency counting. The standard deviation for relative frequency can be measured with respect to different counting time T. FIG. 17 shows an exemplary graph of frequency uncertainty plotted against counting time.

The correlated noise case is sampled from one quad-core cell, while the normal differential case is measured using oscillators which are from different cores but spatially adjacent to cancel their thermal drift. The error slope (due to uncertainty principle) is −10 dB/decade, which agrees with the analysis discussed hereinabove.

Figure 18:
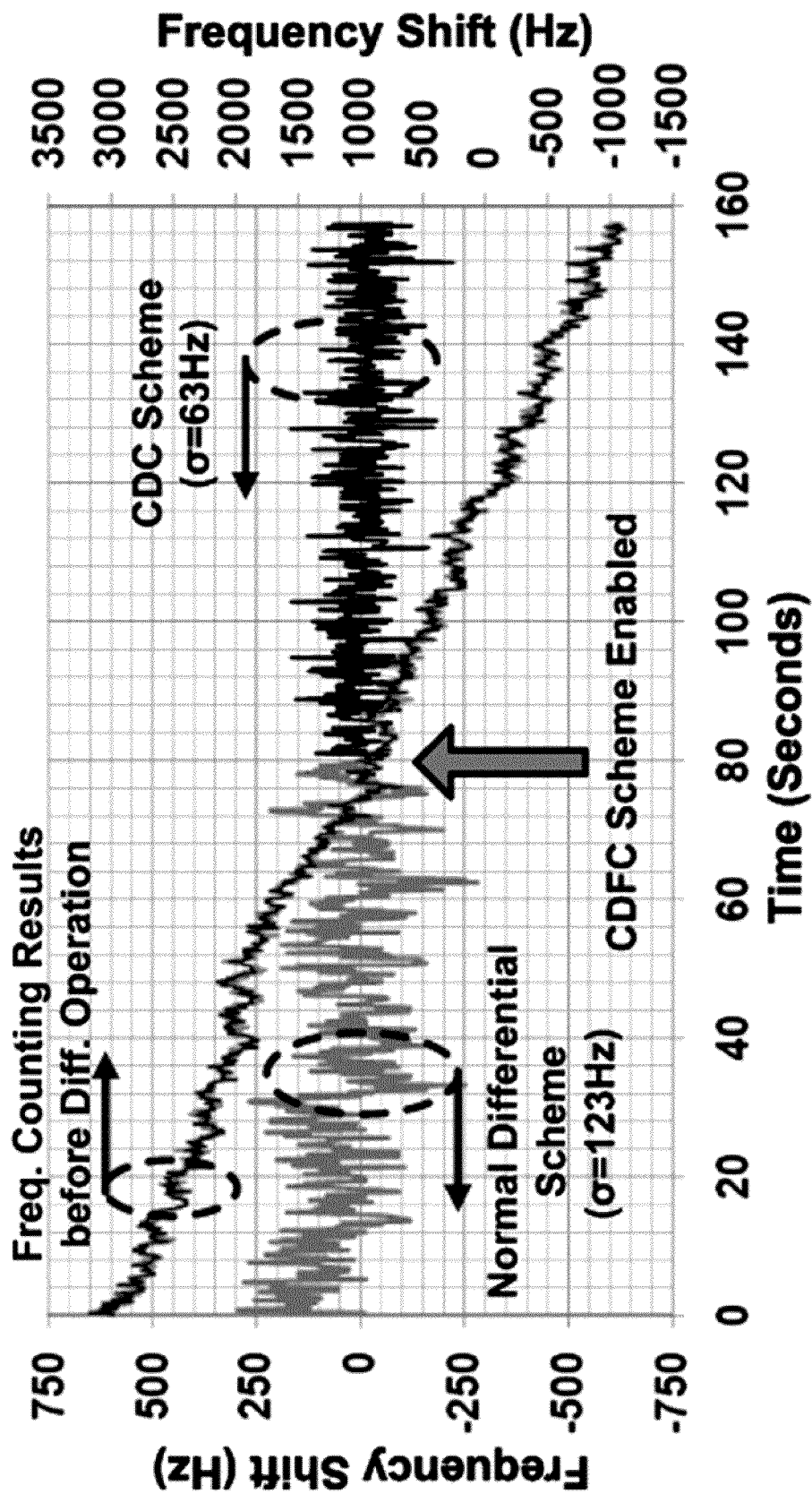
FIG. 18 shows a graph of frequency counting results in the time domain for a CDC scheme, a normal differential scheme and a no differential operation scheme.

At large counting intervals (T>0.01 s), the measured sensor noise reached the minimal noise floor set by the $1/f^3$ phase noise. The CDC scheme achieved a 6 dB noise floor suppression compared with the normal differential scheme. This value is smaller than the theoretically predicted 9.8 dB, which is mainly because part of the total $1/f^3$ phase noise was uncorrelated noise from the switch transistors. FIG. 18 shows a graph of frequency counting results in the time domain for a CDC scheme, a normal differential scheme and a no differential operation scheme.

Sensor Magnetic Sensing Performance

Figure 19:
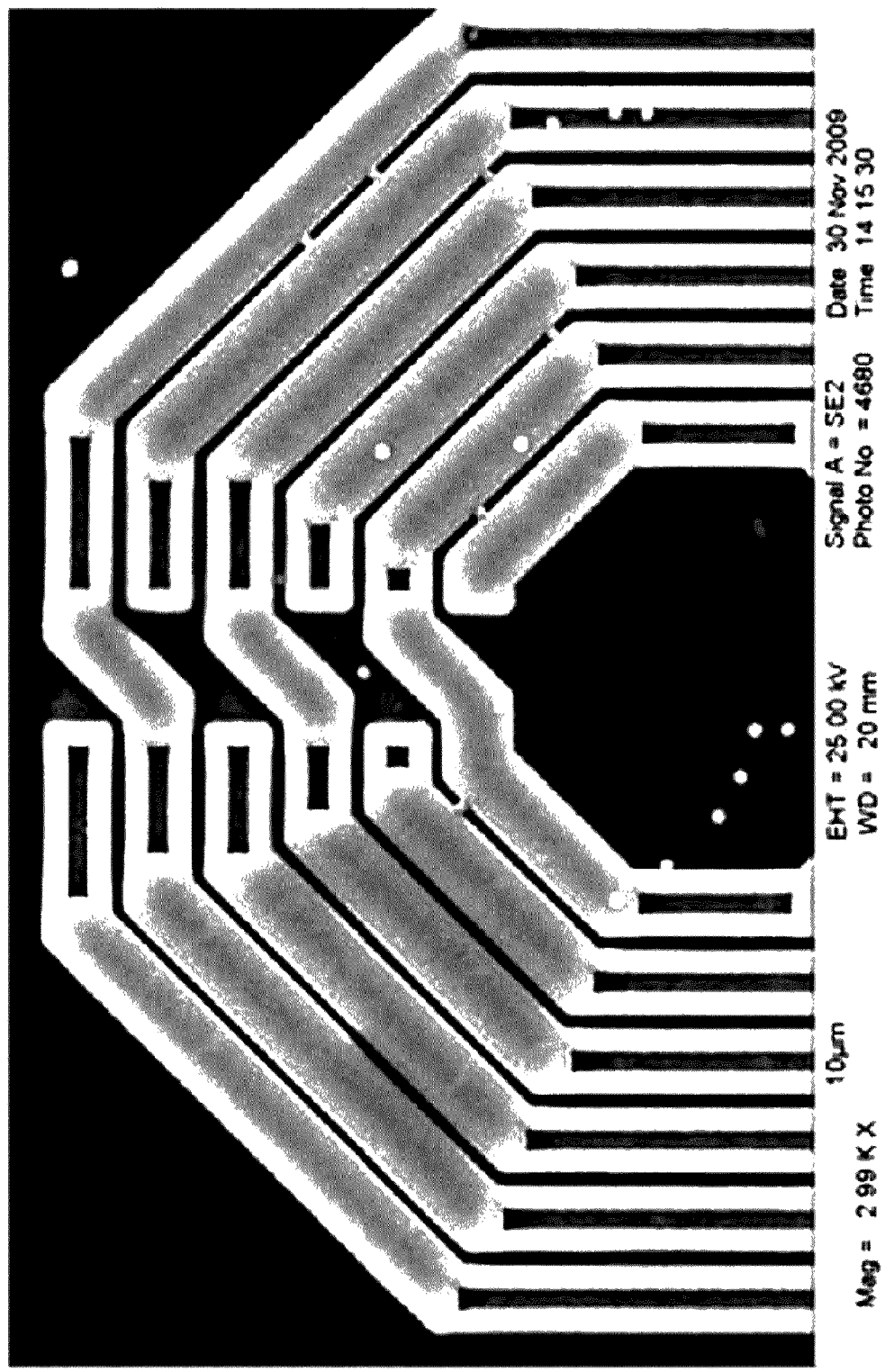
FIG. 19 shows one exemplary SEM image for a sensor site having deposited beads.

To verify the magnetic sensing capability of the sensor, DynaBeads® MyOne™ Carboxylic Acid (Diameter=1 μm), were used as test samples. Solutions with different bead concentrations were deposited onto the sensing site, and the corresponding frequency shifts were measured. The exact quantity of the beads on each site was obtained using scanning electron microscope (SEM) images. FIG. 19 shows one exemplary SEM image for one sensor site having deposited beads.

Figure 20:
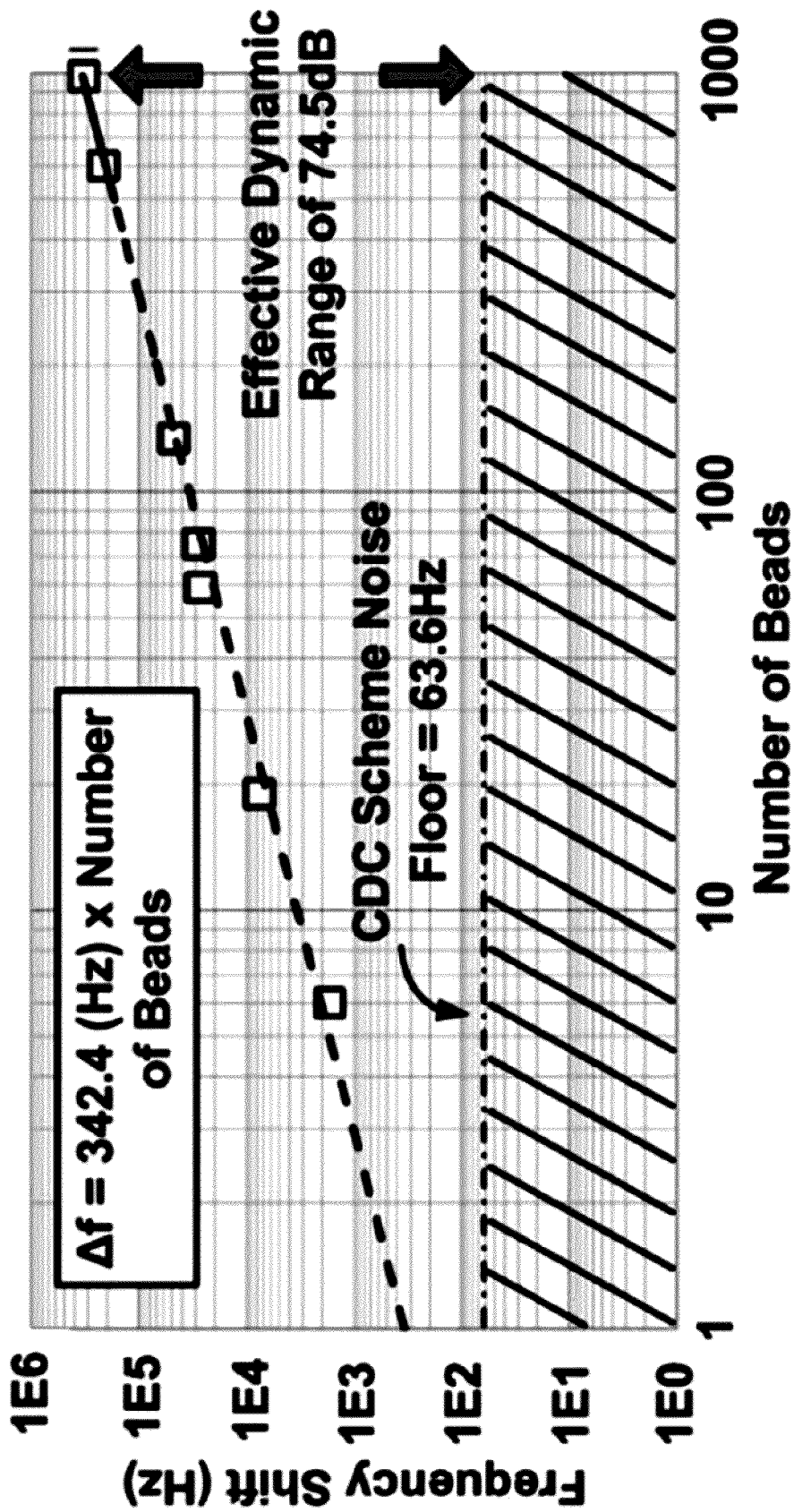
FIG. 20 is a graph showing sensor frequency shift with respect to bead number.

The sensor frequency shift with respect to different bead numbers is shown in the graph of FIG. 20. The extrapolated frequency shift for one single bead is 342.4 Hz with an SNR of 14.6 dB before averaging. The measured sensor linear response (up to 983 beads) indicates an effective dynamic range of at least 74.5 dB. Experiments with bio-samples on genomics level (DNA/RNA) and cellular level (bacteria) are currently under testing.

A scalable ultrasensitive CMOS magnetic sensor array has been described hereinabove. A noise suppression technique which increases the sensitivity without any power overhead has also been described. As an example of the new technique, a 64-cell sensor array was implemented in a 65 nm CMOS process. Measurements made using the 64-cell sensor array verified both the noise suppression capability and the magnetic sensing functionality of the noise suppression techniques in high precision long-term frequency/timing measurements described herein.

Theoretical Background Material

Phase Noise, Jitter, and Measurement Error

Assuming: Tau=Total Counting Time, $f_0$=Ideal Oscillation Frequency, and $\Phi_{error}$=Accumulated Phase Error within T, the accumulated jitter over the total counting time tau is:

$$\sigma_{\frac{\Delta f}{f_0}} = \frac{\sigma_{\varphi,\tau}}{\tau \omega_0} = 2\pi \frac{\sigma_\tau}{T_0} \frac{1}{\tau \omega_0} = \frac{\sigma_\tau}{\tau}$$

Then, using the Wiener-Khinchin theorem, the jitter during differential counting can be calculated by:

$$\sigma_{\tau,diff}^2 = \frac{2}{\omega_0^2} E\{[\phi(t+\tau) - \phi(t)]\}^2 =$$

$$\frac{4}{\omega_0^2}[R_\phi(0) - R_\phi(\tau)] = \frac{8}{\pi \omega_0^2} \int_0^\infty S_\phi(\omega) \sin^2\left[\frac{\omega \tau}{2}\right] d\omega$$

If σT is dominated by uncorrelated noise ($1/f^2$):

$$\sigma_{\frac{\Delta f}{f_0}} = \frac{\sigma_T}{T} = \frac{K\sqrt{T}}{T} = \frac{K}{\sqrt{T}}$$

and the relative frequency error decreases with respect to time (T). This case represents classical averaging of uncorrelated samples.

On the other hand, if σT is dominated by correlated noise ($1/f^3$):

$$\sigma_{\frac{\Delta f}{f_0}} = \frac{\sigma_T}{T} = \frac{\zeta T}{T} = \zeta$$

and a longer counting time does not improve the relative frequency error. In this case, we need to decrease ζ.

Counting, Reset Time, and CDS

Figure 21:
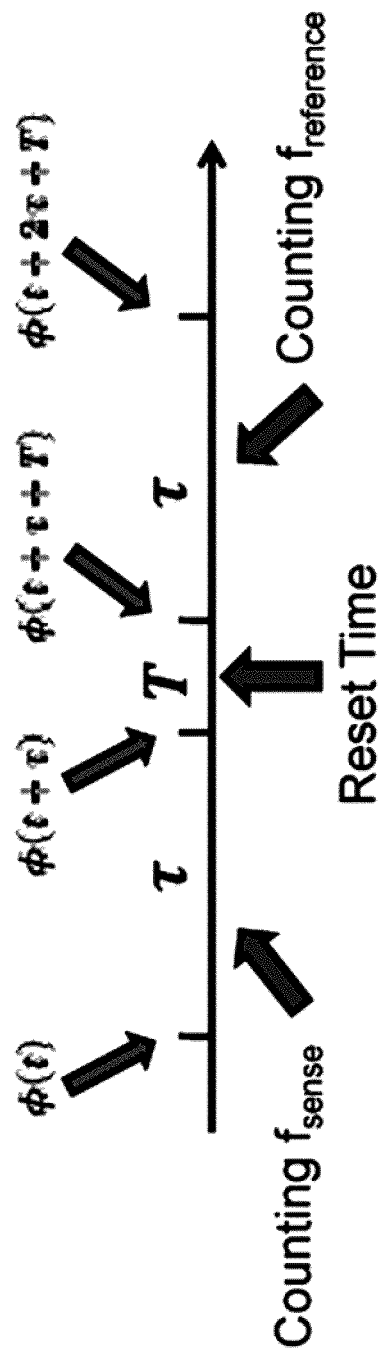
FIG. 21 shows a time line diagram for an NMOS active core having the same $S_\Phi(f)$ during two measurements.

Turning now to the time line diagram of FIG. 21, and assuming an NMOS active core has the same $S_{101}(f)$ during two measurements (for a stationary process):

$$\sigma_{\tau,diff}^2 = \frac{1}{\omega_0^2} E\{\phi(t+2\tau+T) - \phi(t+\tau+T) - [\phi(t+\tau) - \phi(t)]\}^2 =$$

$$\frac{16}{\pi\omega_0^2}\int_0^\infty S_\phi(\omega)\sin^2\left[\frac{\omega\tau}{2}\right]\sin^2\left[\frac{\omega(T+\tau)}{2}\right]d\omega$$

and, considering the following three cases: Case 1: Negligible Reset Time $$\sigma_{\tau,\text{diff}}^2 = \frac{16}{\pi\omega_0^2}\int_0^\infty S_\phi(\omega)\sin^4\left[\frac{\omega\tau}{2}\right]d\omega$$

Case 2: The Same Reset Time and Counting Time $$\sigma_{\tau,\text{diff}}^2 = \frac{64}{\pi\omega_0^2}\int_0^\infty S_\phi(\omega)\sin^4\left[\frac{\omega\tau}{2}\right]\cos^2\left[\frac{\omega\tau}{2}\right]d\omega$$

Case 3: Simple Differential (No Correlated Double Sampling)

$$\sigma_{\tau,\text{diff}}^2 = \frac{8}{\pi\omega_0^2}\int_0^\infty S_\phi(\omega)\sin^2\left[\frac{\omega\tau}{2}\right]d\omega$$

and, by use of the following phase noise model:

$$S_\phi(\omega) = \frac{A/\omega_0^3}{1+\omega^3/\omega_0^3}$$

the calculated $\zeta^2$ is shown in Table 1:

| | Calculated $\zeta^2$ (Normalized) | | |
|---|---|---|---|
| | CDS (T = 0) | CDS (T = τ) | No CDS |
| Mathematica | 2.77 | 4.34 | 26.47 |
| Matlab | 2.77 | 4.34 | 25.80 |

From Table 1, we conclude that CDS decreases $\zeta$ by about 9.8 dB with respect to a simple differential implementation.

Figure 22:
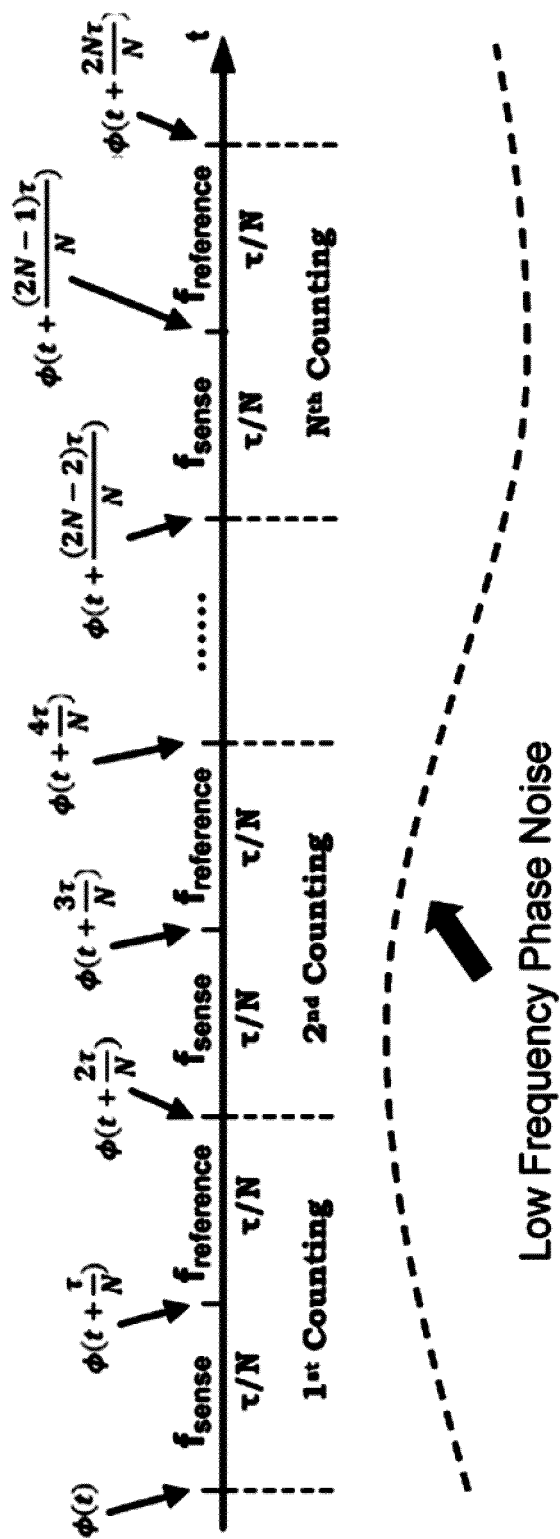
FIG. 22, shows a time line diagram for an NMOS active core having the same $S_\Phi(f)$ during two measurements and a zero reset time.

Interleaving-N Correlated Double Sampling:

For the following description, we divide the total Tau counting time into $\tau/N$ sections and interleaving the CDS. Now referring to the time line of FIG. 22, we assume that the NMOS active core has the same $S_{101}(f)$ during two measurements (a stationary process) and a zero reset time. Thus we can reject the low frequency noise at a much higher rate while maintain the total counting time the same as $\tau$. Now turning to FIG. 23:

$$\phi_E(t) = \left\{\left[\phi\left(t+\frac{2\tau}{N}\right)-\phi\left(t+\frac{\tau}{N}\right)\right]-\left[\phi\left(t+\frac{\tau}{N}\right)-\phi(t)\right]\right\} + \ldots +$$
$$\left\{\left[\phi\left(t+\frac{2N\tau}{N}\right)-\phi\left(t+\frac{(2N-1)\tau}{N}\right)\right]-\right.$$
$$\left.\left[\phi\left(t+\frac{(2N-1)\tau}{N}\right)-\phi\left(t+\frac{(2N-2)\tau}{N}\right)\right]\right\} =$$
$$\sum_{k=0}^{N-1}\left[\phi\left(t+\frac{(2k+2)\tau}{N}\right)-2\phi\left(t+\frac{(2k+1)\tau}{N}\right)+\phi\left(t+\frac{2k\tau}{N}\right)\right]$$

$$\sigma_{\tau,\text{diff}}^2 = \frac{1}{\omega_0^2}E\{\phi_E^2(t)\}, \text{ and } \sigma_{\tau,\text{diff}}^2 = \frac{16}{\pi\omega_0^2}\int_0^\infty S_\phi(\omega)\sin^4\left[\frac{\omega\tau}{2N}\right]\frac{\sin^2[\omega\tau]}{\sin^2\left[\frac{\omega\tau}{N}\right]}d\omega$$

Thus, fractional Counting can be used for accurate counting in this small time steps Tau/N. Note that if N=1, the expression reduces to the simple CDS case:

$$\sigma_{\tau,\text{diff}}^2 = \frac{16}{\pi\omega_0^2}\int_0^\infty S_\phi(\omega)\sin^4\left[\frac{\omega\tau}{2}\right]d\omega$$

Figure 23:
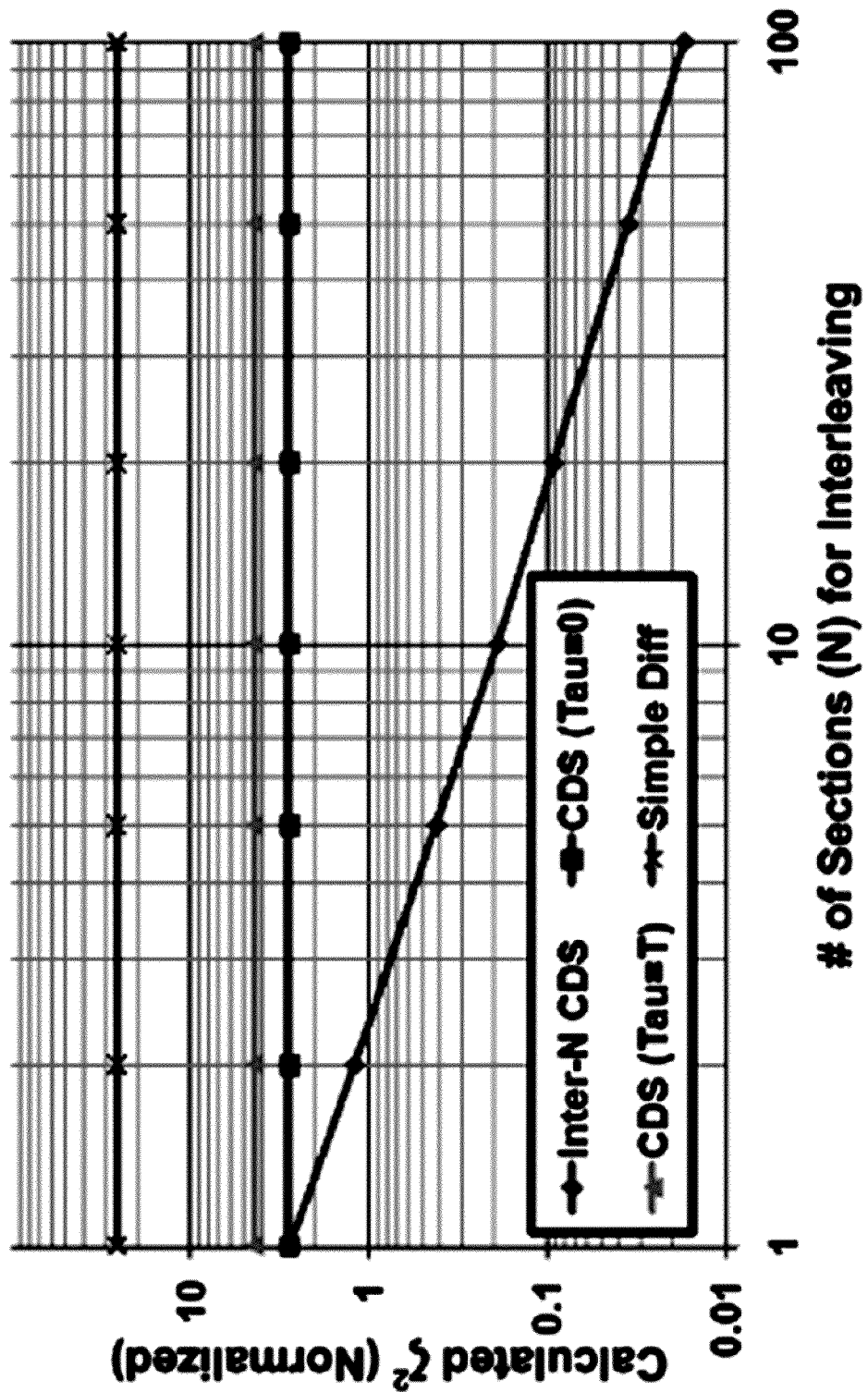
FIG. 23 shows a graph of calculated $\zeta^2$ (normalized) plotted versus the number of interleaved sections (N).

FIG. 23 shows a graph of calculated $\zeta^2$ (normalized) plotted versus the number of sections (N) for interleaving, thus by numerical analysis, showing the effect of interleaving-N correlated double sampling.

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A frequency/timing measurement apparatus comprising:
a reference source having a reference source output terminal;
at least one target source having a target source output terminal, said at least one target source communicatively coupled to said reference source;
said reference source comprising a reference source RC circuit and said at least one target source comprises at least one target source RC circuit and said reference source RC circuit and said at least one target source RC tank are configured to share a common relaxation oscillator amplifier in a selected one of a time multiplexed manner and a simultaneous manner; and
a frequency timing measurement block having a first input terminal electrically coupled to said reference source output terminal, a second input terminal electrically coupled to said target source output terminal, and at least one output terminal, said frequency timing measurement block configured to perform a noise shaping technique to reduce measurement error attributable to a phase noise that is correlated between said reference source and said target source, and to provide a reduced correlated noise measurement at said at least one output terminal.

2. The frequency/timing measurement apparatus of claim 1, wherein said reference source and said at least one target source share at least one common circuit element.

3. The frequency/timing measurement apparatus of claim 2, wherein said at least one common circuit element is shared in a selected one of a time multiplexed manner and a simultaneous manner.

4. The frequency/timing measurement apparatus of claim 1, wherein said phase noise comprises a low frequency phase noise.

5. The frequency/timing measurement apparatus of claim 4, wherein said low frequency phase noise comprises $1/f^3$ noise.

6. The frequency/timing measurement apparatus of claim 1, wherein said frequency/timing measuring apparatus is integrated on a common substrate.

7. The frequency/timing measurement apparatus of claim 1, wherein said frequency timing measurement block comprises a plurality of cascaded delays and frequency counters.

8. The frequency/timing measurement apparatus of claim 7, wherein at least one of said frequency counters comprises a one bit counter.

9. The frequency/timing measurement apparatus of claim 8, comprising M frequency counters and M cascaded delays, each of said M cascaded delays configured to have a delay $T_D$.

10. The frequency/timing measurement apparatus of claim 9, wherein $M*T_D$ is equal to or greater than an oscillation period of a selected one of a reference frequency and a target source frequency.

11. The frequency/timing measurement apparatus of claim 1, wherein said apparatus comprises a magnetic biosensor array.

12. The frequency/timing measurement apparatus of claim 11, wherein said magnetic biosensor array is configured to use a correlated double counting noise suppression technique.

13. A method to reduce correlated noise comprising the steps of:
providing a reference source that generates a reference source signal and at least one target source that generates a target source signal, said reference source and said target source configured to establish a correlation of phase noise between said reference source signal and said at least one target source signal;
providing a measurement block configured to measure a selected one of said reference source signal and said target source signal;
counting N times differentially at least one of said at least one target source signal and said reference signal to provide N differential measurements;
computing a reduced correlated noise measurement of each of said at least one target sources based on an average of said N differential measurements; and
recording each of said reduced correlated noise measurements.

14. The method of claim 13, wherein said step of providing a measurement block comprises providing a frequency timing block.

15. The method of claim 14, wherein said step of providing a frequency timing measurement block comprises providing a fractional computing block.

16. The method of claim 13, wherein said step of counting differentially comprises a simultaneous correlated differential counting scheme.

17. The method of claim 13, wherein said step of counting differentially comprises a normal mode correlated differential counting scheme.

18. The method of claim 13, wherein said step of counting differentially comprises an interleaving N mode correlated differential counting scheme.

19. The method of claim 13 wherein said step of counting differentially comprises counting differentially over a time interval of $\tau/N$, where $\tau$ is a total accumulated measurement for a selected one of a measurement of said reference source and a measurement of said target source and N is the total number of the interleaving sections.

20. The method of claim 15, wherein said fractional computing block comprises a plurality of cascaded delays and frequency counters.

21. The method of claim 13, wherein said phase noise comprises a low frequency phase noise.

22. The method of claim 21, wherein said low frequency phase noise comprises $1/f^3$ noise.

23. The method of claim 13, wherein said step of providing a reference source and at least one target source further comprises providing a reference source LC tank circuit and at least one target source LC tank circuit, said reference source LC tank circuit and at least one target source LC tank circuit configured to share a common oscillator active core in a selected one of a time multiplexed manner and a simultaneous manner.

24. The method of claim 13, wherein said step of providing a reference source and at least one target source further comprises providing a reference source RC circuit and at least one target source RC circuit, said reference source RC circuit and at least one target source RC circuit configured to share a common relaxation oscillator amplifier in a selected one of a time multiplexed manner and a simultaneous manner.

25. A frequency/timing measurement apparatus comprising:
a reference source having a reference source terminal;
at least one target source having a target source terminal;
at least one active core having at least two active core inputs, and an active core output terminal, said active core configured to generate a frequency representative of a selected one of an inductance of said at least one target source and an inductance of said reference source;
a switching circuit configured to electrically couple to said active core in a selected one of a time multiplexed manner and a simultaneous manner to a selected one of said reference source terminal and said at least one target source terminal; and
a frequency timing measurement block having a frequency timing measurement block input terminal electrically coupled to said active core output terminal, and at least one frequency timing measurement block output terminal, said frequency timing measurement block configured to perform a noise shaping technique to reduce measurement error attributable to a phase noise that is correlated between said reference source and said target source, and to provide a reduced correlated noise measurement at said at least one frequency timing measurement block output terminal.

26. The frequency/timing measurement apparatus of claim 25, wherein said reference source and said at least one target source share at least one common circuit element.

27. The frequency/timing measurement apparatus of claim 26, wherein said at least one common circuit element is shared in a selected one of a time multiplexed manner and a simultaneous manner.

28. The frequency/timing measurement apparatus of claim 25, wherein said phase noise comprises a low frequency phase noise.

29. The frequency/timing measurement apparatus of claim 28, wherein said low frequency phase noise comprises $1/f^3$ noise.

30. The frequency/timing measurement apparatus of claim 25, wherein said reference source comprises a reference source LC tank circuit and said at least one target source comprises at least one target source LC tank circuit and said reference source LC tank circuit and said at least one target source LC tank circuit are configured to share a common oscillator active core in a selected one of a time multiplexed manner and a simultaneous manner.

31. The frequency/timing measurement apparatus of claim 30, wherein said apparatus comprises one or more integrated cells, each integrated cell having a plurality of LC tank circuits, one of said LC tank circuits serving as said reference source LC tank circuit.

32. The frequency/timing measurement apparatus of claim 31, wherein said apparatus comprises two or more integrated cells addressed in a time multiplexed manner by a plurality of multiplexers.

33. The frequency/timing measurement apparatus of claim 25, wherein said frequency/timing measuring apparatus is integrated on a common substrate.

34. The frequency/timing measurement apparatus of claim 25, wherein said frequency timing measurement block comprises a plurality of cascaded delays and frequency counters.

35. The frequency/timing measurement apparatus of claim 34, wherein at least one of said frequency counters comprises a one bit counter.

36. The frequency/timing measurement apparatus of claim 35, comprising M frequency counters and M cascaded delays, each of said M cascaded delays configured to have a delay $T_D$.

37. The frequency/timing measurement apparatus of claim 36, wherein $M*T_D$ is equal to or greater than an oscillation period of a selected one of a reference frequency and a target source frequency.

38. The frequency/timing measurement apparatus of claim 25, wherein said apparatus comprises a magnetic biosensor array.

39. The frequency/timing measurement apparatus of claim 38, wherein said magnetic biosensor array is configured to use a correlated double counting noise suppression technique.

* * * * *